United States Patent
Augustyniak et al.

(10) Patent No.: US 7,298,224 B2
(45) Date of Patent: Nov. 20, 2007

(54) AMPLIFIER CIRCUIT FOR AN OSCILLATOR IN A DEFINED OSCILLATING FREQUENCY RANGE AND OSCILLATOR CIRCUIT

(75) Inventors: Marcin Augustyniak, Freising (DE); Ralf Brederlow, Ping (DE); Marc Tiebout, Munich (DE)

(73) Assignee: Infineon Technologies AG, Munich (DE)

( * ) Notice: Subject to any disclaimer, the term of this patent is extended or adjusted under 35 U.S.C. 154(b) by 47 days.

(21) Appl. No.: 11/361,042

(22) Filed: Feb. 23, 2006

(65) Prior Publication Data

US 2006/0208815 A1 Sep. 21, 2006

(30) Foreign Application Priority Data

Feb. 23, 2005 (DE) .................. 10 2005 008 332

(51) Int. Cl.
*H03B 5/36* (2006.01)
(52) U.S. Cl. .................. 331/107 A; 331/177 R
(58) Field of Classification Search .............. 331/65, 331/107 A, 175, 177 R
See application file for complete search history.

(56) References Cited

U.S. PATENT DOCUMENTS 4,947,141 A * 8/1990 Atkinson et al. ............ 331/135

6,137,370 A 10/2000 Yamamoto

FOREIGN PATENT DOCUMENTS

| DE | 103 08 975 A1 | 2/2004 |
|---|---|---|
| DE | 699 11 281 T2 | 6/2004 |

OTHER PUBLICATIONS

Brederlow et al., "Biochemical Sensors Based on Bulk Acoustic Wave Resonators," Infineon Technologies, Munich, pp. 1-3, (3 pages).

* cited by examiner

*Primary Examiner*—David Mis
(74) *Attorney, Agent, or Firm*—Maginot, Moore & Beck

(57) ABSTRACT

An amplifier circuit for an oscillator in a defined oscillating frequency range includes a plurality of transconductors, wherein at least one transconductor has a positive transconductance, and wherein at least one other transconductor has a negative transconductance, wherein the transconductors together provide a positive amplification, and a passive impedance element coupled to at least one fed back transconductor, wherein the transconductance of the transconductor and the impedance element are dimensioned so that, in the oscillating frequency range, a given phase difference is present between a signal at the input and a signal at the output.

26 Claims, 3 Drawing Sheets

AMPLIFIER CIRCUIT FOR AN OSCILLATOR IN A DEFINED OSCILLATING FREQUENCY RANGE AND OSCILLATOR CIRCUIT

CROSS-REFERENCE TO RELATED APPLICATION

This application claims priority from German Patent Application No. 10 2005 008 332.3, which was filed on Feb. 23, 2005, and is incorporated herein by reference in its entirety.

BACKGROUND OF THE INVENTION

1. Field of the Invention

The present invention relates to amplifier circuits and particularly to amplifier circuits for oscillators that are to have a high phase difference between input and output.

2. Description of the Related Art

The BAW (bulk acoustic wave technology) allows piezoelectric resonant elements that, for example, operate in the longitudinal wave mode and whose frequency (about 1-2 GHz) depends on the mass and elasticity coefficients of the resonator. These resonant elements are applied in RF (radio frequency) filters. A further field of application of so-called FBAR (film bulk acoustic wave resonator) are mass sensors (for example for biochemical or other applications). For this purpose, quartz crystal micro balances have primarily been used in the past. However, FBAR have a substantially higher measurement sensitivity compared to quartz crystal micro balances due to their higher resonant frequency. A further advantage of the FBAR is their integrability and thus more inexpensive manufacturing and the possibility of using them in sensor matrices.

The output signal of such an FBAR is the resonant frequency depending on the additional mass that is bound on the surface of the resonator and is to be measured. This requires the resonators to function not only in air (as is the case for RF filters), but also in water, for example.

Two methods are known for measuring the frequency:
1. Measuring the change of the S-parameters before and after the change of the surface mass. However, this approach has three major disadvantages: 1) the measurement is not accurate, 2) the expensive S-parameter measurement setup is not applicable for reading out in mass products, and 3) the measurement has to be done with the resonator in air. This requires the sensor to be dried before the measurement, which makes the whole procedure complex.
2. Use of a hybrid circuit oscillator. FIG. 3 shows a basic solution for an amplifier circuit having an amplifier 11 and a resonator 12, here specifically an FBAR (film bulk acoustic wave resonator). FBAR are used in biochemistry, for example as mass sensors for gases or liquids. Depending on the chemical structure of the gases or liquids, additional mass is bound on the FBAR. This results in a change of the FBAR's resonant frequency. The output voltage $V_{out}$ generated by the amplifier 11 is attenuated/amplified and phase shifted by the resonator 12 and is returned to the input of the amplifier as input voltage $V_{in}$ via a feedback loop.

The main problem for the use of FBAR in rough environments, for example water, is the poor quality, i.e. only a small phase shift and a high attenuation at resonant frequency.

FIG. 4 shows two curves of an FBAR. The upper curve represents the amplitude response ($V_{in}/V_{out}$). The lower curve represents the phase response ($V_{in}/V_{out}$). The frequency in Hertz is plotted along the x-axis of both curves. For the amplitude response, the amplification in dB is plotted along the y-axis. The phase shift in degrees is plotted along the y-axis of the phase response. The maximum phase shift between $V_{in}$ and $V_{out}$ is about −60°, for the resonant frequency of 1.89 GHz, the phase shift is even as low as −30°, while the attenuation is still 2 dB. To form an oscillating circuit with a total amplification of about 3 dB and a phase shift of 360°, the amplifier has to achieve an amplification of about 5 dB and a phase delay of −330°.

The specialist publication "Biochemical sensors based on bulk acoustic wave resonators" by R. Brederlow et al. shows an amplifier for an oscillator having an FBAR, wherein the amplifier comprises two transistors. The collector electrodes of both transistors are coupled to a supply voltage, wherein the FBAR is connected to the emitter electrode of the first transistor, wherein the base electrode of the second transistor is connected to the collector electrode of the first transistor via a decoupling capacitor and a voltage divider, and the output voltage is tapped at the emitter electrode of the second transistor. The base electrode of the first transistor is coupled to a conducting element.

The disadvantage of the described known circuit is the frequency dependence of the phase shift due to the invariable conducting element and the associated potential detuning of the oscillator circuit. If the amplification-phase relationship of the amplifier is not precisely tuned to the resonator, the amplifier may not oscillate or it oscillates at another frequency than the resonant frequency of the resonator, which is undesirable since the frequency then does no longer react to mass changes, i.e. no more measurements are possible. A further disadvantage is the major space requirement of a conducting element and the inflexibility with respect to the adjustment possibilities, because the operating point of both transistors is controlled by only one supply voltage.

SUMMARY OF THE INVENTION

It is the object of the present invention to take the poor quality of the resonator into account when designing and dimensioning the amplifier circuit, and that the amplifier meets the oscillation requirement exactly in the resonant frequency range of the resonator despite a small phase shift and a high attenuation of the resonator at resonant frequency. Furthermore, the amplifier or the oscillator circuit is to be flexibly adjustable with respect to the phase shift and realizable in an efficient way.

In accordance with a first aspect, the present invention provides an amplifier circuit having an amplifier input and an amplifier output for an oscillator having an oscillating frequency in a defined oscillating frequency range, having a plurality of at least three transconductors, wherein the transconductors are designed to map an input voltage to an output current considering the transconductance, wherein at least one transconductor has a positive transconductance, and wherein at least one other transconductor has a negative transconductance, and wherein the transconductors together provide a positive amplification; wherein a first transconductor is coupled to the amplifier input on the input side, wherein a second transconductor is coupled to an output of the first transconductor on the input side and has a feedback from an output of the same to an input of the same, wherein a third transconductor is coupled to an output of the first transconductor and an output of the second transconductor on the input side, and wherein at least one passive impedance element is provided, which is coupled to the output of the first transconductor, wherein the transconductances of the transconductors and the at least one impedance element are dimensioned so that, in the defined oscillating frequency range, a given phase difference is present between a signal at the amplifier input and a signal at the amplifier output.

In accordance with a second aspect, the present invention provides an oscillator circuit having the above-mentioned amplifier circuit and a resonator connected between the amplifier input and the amplifier output, wherein the resonator is an FBAR (film bulk acoustic wave resonator).

The present invention provides an amplifier circuit comprising: a plurality of transconductors, wherein at least one transconductor has a positive transconductance, and wherein at least one other transconductor has a negative transconductance, and wherein the transconductors together provide a positive amplification; wherein the first transconductor is coupled to the amplifier input on the input side, the second transconductor is coupled to an output of the first transconductor on the input side and comprises a feedback from an output of the same to an input of the same, wherein the third transconductor is coupled to an output of the first transconductor and an output of the second transconductor on the input side, and a passive impedance element coupled to at least one transconductor, wherein not only the amplification, but also the phase shift of the amplifier is exactly adjustable via the transconductances of the transconductors, particularly to the resonant frequency of a resonator.

The present invention is based on the finding that the transconductances of the transconductors do not only serve for amplifier adjustment, as is otherwise the case in transconductors, but that the phase shift of the amplifier circuit is also adjusted by means of the transconductances. In a normal chain circuit of transistor amplifiers, the transconductances, i.e. the amplifier factors of the amplifiers, hardly have any influence at all on the phase shift.

However, the invention achieves that the transconductances, i.e. the amplification factors of the amplifiers, also influence the phase shift of the amplifier circuit. For this purpose, a chain circuit of the first and the third transconductors, TK1 and TK3, is complemented by a second transconductor TK2 which is connected between the first and the third one and is additionally also fed back. The impedance element IE1 is also connected to the node with which the second transconductor TK2 is coupled.

By selecting the signs of the transconductances, the invention achieves that no inductances are required, and capacitive impedance elements only are sufficient. Parallel connection of the second fed back transconductor TK2 and the at least one impedance element IE1 further achieves that the value of the at least one impedance element may be small, because this value is always "enlarged" by the transconductance of the second transconductor TK2, which is fed back, due to the mutual connection.

For calibrating the phase shift of the amplifier circuit, for example after manufacturing or for a changed environmental condition, there may simply be done a transconductance adjustment performed externally according to the invention. If the transconductors are designed as transistors, the operating point of the transistor simply has to be adjusted for this purpose.

In prior art, this tuning is not possible because a conducting element or fixed concentrated elements are used as impedance element. In prior art, this results in much reject in manufacturing or in a very limited field of application, wherein the problems are not present in the invention.

A preferred embodiment of the present invention further allows a change of the transconductances of the transconductors by two variable current sources and thus a change of the phase shift and the amplification of the amplifier circuit.

An inventive amplifier circuit is thus ideally suited for the use with a resonator of low quality, for example the FBAR described by FIG. 4. Here, the transconductances of the transconductors and the capacitances of the impedance elements of the amplifier circuit are dimensioned so that a necessary phase shift for the term $-G_{m2}+C_1$ and hence a phase shift required as a whole by the oscillation requirement for the entire amplifier circuit results from the transconductance $G_{m2}$ of the second fed back transconductor TK2 and the capacitance $C_1$ of the first impedance element IE1. Combined with the phase shift of the resonator at the resonant frequency, this meets the oscillation requirement for the oscillator circuit.

The inventive amplifier circuit includes transconductors and at least one impedance element and may thus easily be integrated onto a chip, particularly with FBAR, because the transconductors may readily be realized as transistors and because even a capacitive impedance element is sufficient as impedance element, which may also be realized by a transistor.

The integration has two major advantages. First, the parasitic impedances of the connection lines between the resonator and the amplifier circuit in an integrated chip solution are considerably smaller as compared to prior art, a hybrid solution, which in turn further increases the performance of the measuring device. Second, the invention thus allows cost-effective manufacturing of, for example, biochemical one-way diagnosis systems, for whose mass market success low-cost manufacturing is indispensable.

BRIEF DESCRIPTION OF THE DRAWINGS

Preferred embodiments of the present invention will be explained in detail in the following with respect to the accompanying drawings, in which.

DESCRIPTION OF THE PREFERRED EMBODIMENTS

Figure 1:
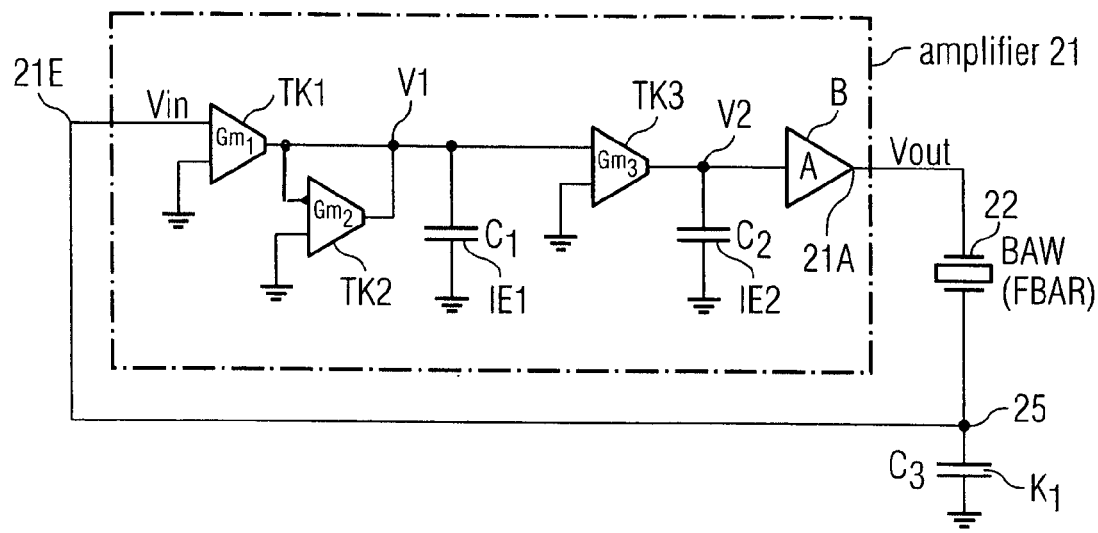
FIG. 1 shows a block circuit diagram of an inventive circuit for an oscillator in a defined oscillating frequency range.

FIG. 1 shows a block circuit diagram of an inventive amplifier circuit 21 for an oscillator in a defined oscillating frequency range coupled to a resonator, here an FBAR 22, and a feedback of the output signal at the input of the amplifier. $V_{in}$ is the input voltage of the amplifier, and $V_{out}$ is the output voltage of the amplifier. The amplifier circuit has three transconductors, a first transconductor TK1 defined by the transconductance $G_{m1}$, a second transconductor TK2 defined by a transconductance $G_{m2}$, and a third transconductor TK3 defined by a transconductance $G_{m3}$. Furthermore, the amplifier has a buffer B with an amplification factor A=1 and two impedance elements, a first impedance element IE1 with the capacitance $C_1$, and a second impedance element IE2 with the capacitance $C_2$. The transconductor TK1 is coupled to the amplifier input 21E. The transconductor TK2 is coupled to the output of the first transconductor TK1 on the input side, wherein the output of the transconductor TK2 is connected to the input of the transconductor TK2 by feedback. The transconductor TK3 is coupled to the output of the transconductor TK2 on the input side, and the buffer B is coupled to the output of the transconductor TK3 on the input side and to the amplifier output 21A on the output side. The impedance element IE1 is connected between the output of the transconductor TK2 and the input of the transconductor TK3, and impedance element IE2 is connected between the output of the transconductor TK3 and the input of the buffer B. The resonator 22 is connected between the amplifier output 21A and the amplifier input 21E. A capacitor K1 having the capacitance $C_3$ is connected between the node point 25 and a ground point.

This allows to derive that the following applies to the amplifier:

$$V_{out}/V_{in}=G_{m1}*G_{m3}/(-sC2*(-G_{m2}+sC_1)$$

wherein $V_{out}$ is the output voltage of the amplifier 21,
wherein $V_{in}$ is the input voltage of the amplifier 21,
wherein $G_{m1}$ is the transconductance of the first transconductor TK1,
wherein $G_{m2}$ is the transconductance of the second transconductor TK2,
wherein $G_{m3}$ is the transconductance of the third transconductor TK3,
wherein $C_1$ is the capacitance of the first impedance element IE1,
wherein $C_2$ is the capacitance of the second impedance element IE2, and
wherein s is an angular frequency.

Figure 4:
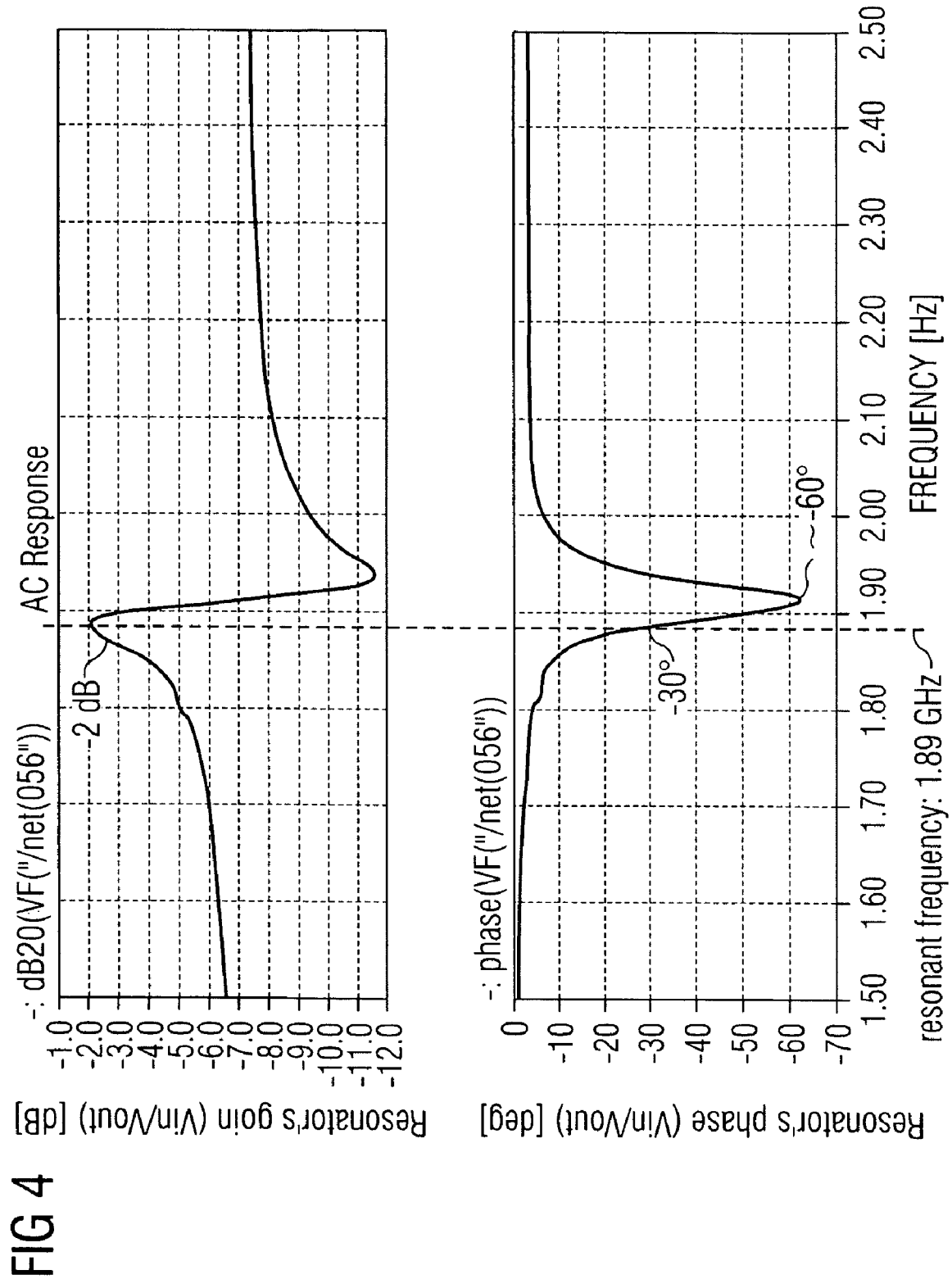
FIG. 4 shows curves of an FBAR ($V_{in}/V_{out}$: phase and amplitude response).

In order to realize a sufficient phase shift of −330° for the above example of an FBAR with the curves according to FIG. 4 to meet the resonance requirement for an oscillating circuit of 0° and/or 360°, either the transconductance $G_{m1}$ or the transconductance $G_{m3}$ should be negative and the other one positive. In addition, the transconductance $G_{m2}$ has to be negative, and the term $-G_{m2}+sC_1$ has to have a phase angle of 60° with the angular frequency s. The amplification-phase relationship for the resonant frequency is based on the tuning between the components. Further rearrangement of the above equation yields the following:

$$V_{out}/V_{in}=-G_{m1}/G_{m2}*1/(1+(sC_1/G_{m2}))*(G_{m3}/sC_2)$$

When the transconductances $G_{m1}$, $G_{m2}$ and $G_{m3}$ are tuned and the capacitances $C_1$ and $C_2$ of the impedance elements are also tuned, the time constants $t_1=C_1/G_{m2}$ and $t_2=C_2/G_{m3}$ are further also tuned, the amplification-phase relationship is thus independent of process/temperature changes. In order to guarantee that the above time constants are tuned to the resonant frequency, a transconductance adaptation ($g_m$ tuning) is possible in the oscillator circuit by adapting the bias currents of the transconductors.

Figure 2:
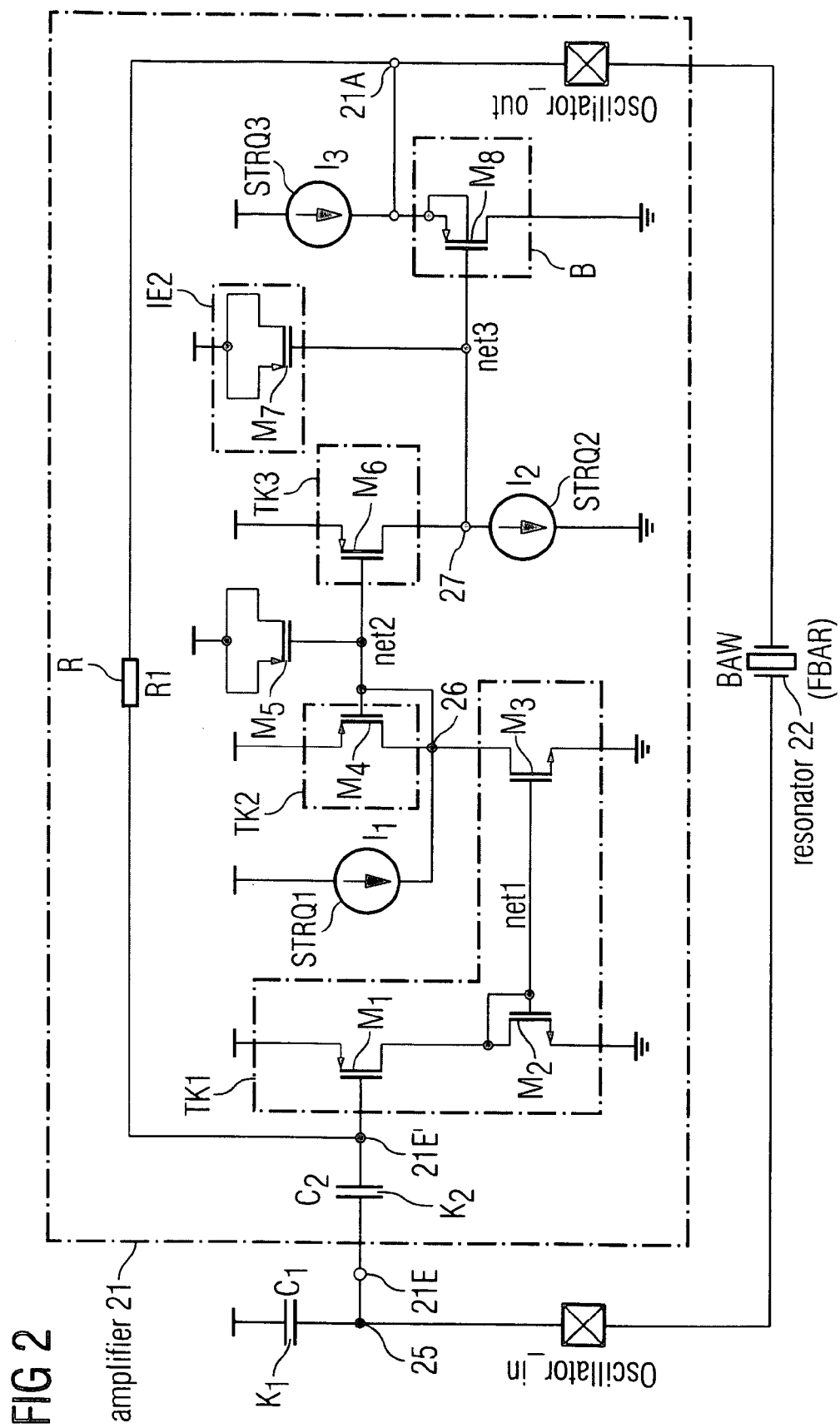
FIG. 2 shows a block circuit diagram of a preferred embodiment of the present invention.

In the following, a preferred embodiment of the inventive amplifier circuit for an oscillator in a defined oscillating frequency range is illustrated with respect to FIG. 2. The first transconductor TK1 comprises three transistors M1, M2 and M3, wherein the gate electrode of the transistor M1 is connected to the amplifier input 21E, and the transistors M2 and M3 constitute a current mirror, and wherein the drain electrodes of the transistors M1 and M2 are further coupled. The drain electrode of the transistor M3 constitutes the output of the transconductor TK1 and is connected to the node point 26. A current source STRQ1 is further connected to the node point 26. The transconductor TK2 comprises a transistor M4 whose gate and drain electrodes are connected to node point 26 and whose source electrode is connected to a reference potential. Transconductor TK3 comprises a transistor M6 whose gate electrode is coupled to the node point 26, whose source electrode is coupled to a reference potential, and whose drain electrode is coupled to the node 27. The transistor M4 of the transconductor TK2 and the transistor M6 of the transconductor TK3 constitute a second current mirror.

Figure 3:
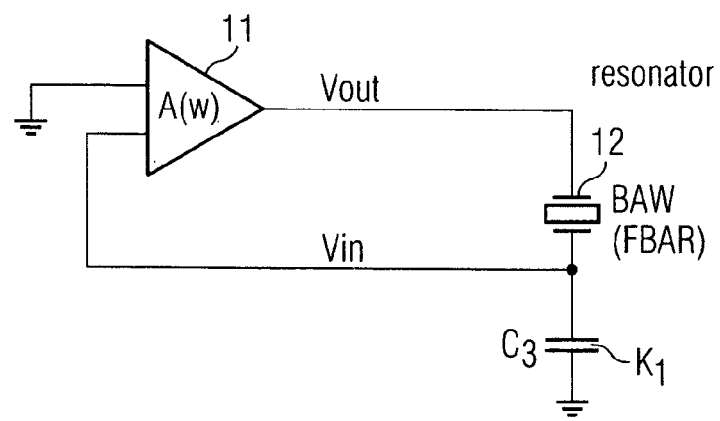
FIG. 3 shows a circuit diagram of a basic hybrid amplifier circuit for FBAR.

The transistor M5 is connected between reference node 26 and a reference potential so that the gate-channel capacitances of the transistors M4, M5 and M6 yield a predetermined impedance value. Impedance element IE2 comprises a transistor M7 whose gate electrode is connected to node point 27, and whose drain and source electrodes are shorted and coupled to a reference potential. Furthermore, a second current source STRQ2 having the current $I_2$ is coupled to the node point 27. The buffer (B) comprises a transistor M8 whose gate electrode is connected to the reference node 27, whose drain electrode is connected to the ground point, and whose source electrode is connected to the amplifier output 21A. Furthermore, a third current source STRQ3 is coupled to the source electrode of the transistor M8 and/or the amplifier output 21A. The capacitor K2 having the capacitance $C_2$ is connected between amplifier input 21E and the gate electrode of the transistor M1 and only serves for the direct current decoupling, wherein an additional benefit is that no further ESD protection is necessary with this capacitor. The node point 21E' may thus also be considered as internal amplifier input. An ohmic resistor R having a value R1 is connected between internal amplifier input 21E' and the amplifier output 21A. The capacitor K1 connected between node point 25 and a reference potential realizes the capacitor $K_1$ in FIG. 3 having the capacitance value $C_3$.

With the current mirror of M2 and M3, the transistor M1 realizes the positive transconductance $G_{m1}$ of the transconductor TK1, wherein the following equation applies:

$$G_{m1}=g_m(M1)*g_m(M3)/g_m(M2)$$

The transconductance $G_{m2}$ of the transconductor TK2 is defined by the transistor M4, wherein the following equation applies:

$$G_{m2}=-g_m(M4)$$

Likewise, the transconductance $G_{m3}$ of the transconductor TK3 is defined by the transistor M6, wherein the following equation applies:

$$G_{m3}=-g_m(M6)$$

The capacitance $C_1$ of the impedance element IE1 is defined by the gate-channel capacitances of the transistors M4, M5 and M6. Furthermore, the capacitance $C_2$ of the impedance element IE2 of FIG. 2 is defined by the gate-channel capacitance of the transistor M7. The transistor M8 realizes the buffer B with the amplification A=1 in source following circuit. The loop containing transistor M8, current source STRQ3, resistor R, and transistors M1, M2, M3, M4, current source STRQ1, transistor M6, and current source STRQ2 defines the operating points (biasing) of all transistors of this switching network. The following equations may be derived:

$$I(M2)=I(M1)$$

$$I(M3)=I(M2)*W(M3)/W(M2)$$

$$I(M4)=I(M3)-I1$$

$$I(M6)=I(M4)*W(M6)/W(M4)$$

$$I(M6)=I2$$

$$I(M8)=I3$$

wherein I represents either the drain-source current of the respective transistors or the current of the respective current source, wherein W is further the gate width of the respective transistor, and wherein it is further assumed that the following applies for the gate length L: L(M3)=L(M2) and L(M6)=L(M4). What is derived from the above equations is that the currents I1 and I2 determine the currents of the transistors M1, M2, M3, M4 and M6 and thus control the transconductances of the transconductors $G_{m1}$, $G_{m2}$ and $G_{m3}$. The currents I1 and I2 may be adapted to compensate for the change of the time constants t1 and t2 induced by process and temperature. For the loop to be stable, the time constant $R_1*C_{in}$ has to be larger than any other time constant within this loop, particularly the time constant Cgs(M7)/gds(M6) resulting from the gate-source capacitance of the transistor M7 of the second impedance element IE2 and the drain-source conductance of the transistor M6 of the third transconductor TK3. Wherein $C_{in}$ is the input capacitance of the amplifier circuit.

The reason for an independent current source I1 is to be explained in the following. For the conductances $G_{m1}$, $G_{m2}$ and $G_{m3}$ to be on different bias current levels, the drain-source saturation voltages $V_{dssat}$ of M1, M4 and M6 have to be equal. On the other hand, it is advantageous for reasons of noise when $V_1/V_{out}>1$ applies to the amplification (of FIG. 1), which requires that $-G_{m1}/G_{m2}>1$. In order to be able to meet these two requirements, an additional current source is necessary.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. An amplifier circuit having an amplifier input and an amplifier output for an oscillator having an oscillating frequency in a defined oscillating frequency range, comprising:
   a set of at least three transconductors, wherein the transconductors are configured to map an input voltage to an output current considering a transconductance of the set of at least three transconductors, wherein at least one transconductor has a positive transconductance, and wherein at least one other transconductor has a negative transconductance, and wherein the transconductors together provide a positive amplification;
   wherein a first transconductor has an input coupled to the amplifier input,
   wherein a second transconductor has an input coupled to an output of the first transconductor and has a feedback connection from an output of the second transconductor,
   wherein a third transconductor has an input coupled to an output of the first transconductor and an output of the second transconductor, and
   wherein at least a first passive impedance element is coupled to the output of the first transconductor, wherein the transconductance and the at least first impedance element are dimensioned so that, in the defined oscillating frequency range, a given phase difference is present between a signal at the amplifier input and a signal at the amplifier output.

2. The amplifier circuit of claim 1,
wherein the transconductance and the first impedance element are dimensioned so that the total phase difference is larger than 200°.

3. The amplifier circuit of claim 1,
wherein the first impedance element is connected between a transconductor output and a ground point.

4. The amplifier circuit of claim 1,
wherein the first impedance element is a capacitive element.

5. The amplifier circuit of claim 1,
wherein the first impedance element is a transistor having a control input and two other terminals, the transistor connected so that the control input represents a first capacitance electrode and a second capacitance electrode is realized by short circuit of the two other terminals.

6. The amplifier circuit of claim 1,
wherein the first impedance element is connected between the output of the second transconductor and the ground point.

7. The amplifier circuit of claim 1,
further comprising a second impedance element coupled to a transconductor output of the third transconductor and the ground point.

8. The amplifier circuit of claim 1,
wherein the transconductance of the set of at least three transconductors and the at least first impedance element are dimensioned so that the following equation is met:

$$V_{out}/V_{in}=-G_{m1}/G_{m2}*1/(1+(sC_1/G_{m2})*G_{m3}/sC_2$$

wherein $V_{out}$ is an output voltage of the amplifier,
wherein $V_{in}$ is an input voltage of the amplifier,
wherein $G_{m1}$ is the transconductance of the first transconductor,
wherein $G_{m2}$ is the transconductance of the second transconductor,
wherein $G_{m3}$ is the transconductance of the third transconductor,
wherein $C_1$ is a capacitance of a first impedance element,
wherein $C_2$ is a capacitance of a second impedance element,
wherein s is equal to an angular frequency in the defined oscillating frequency range.

9. The amplifier circuit of claim 1,
further comprising a capacitive element connected to the amplifier input, and further connected to a reference voltage.

10. The amplifier circuit of claim 1,
further comprising a capacitive element connected in series between the amplifier input and the input of the first transconductor.

11. The amplifier circuit of claim 1,
further comprising an ohmic resistor operably connected between the amplifier output and an internal amplifier input.

12. The amplifier circuit of claim 11,
wherein the ohmic resistor is dimensioned so that a time constant $R1*C_{in}$ is larger than another time constant in the circuit, wherein R1 is a resistance of the ohmic resistor, wherein $C_{in}$ is an input capacitance of the amplifier circuit, and wherein the other time constant is formed by a ratio of a transconductance of a select one of the set of at least three transconductors and a value of an impedance element associated with the select transconductor.

13. The amplifier circuit of claim 1,
wherein the first transconductor comprises a first transistor, a second transistor, and a third transistor, wherein a gate electrode of the first transistor is connected to the amplifier input, wherein the second transistor and the third transistor are connected as a current mirror, wherein a drain electrode of the second transistor is further coupled to a drain electrode of the first transistor, and wherein a drain electrode of the third transistor constitutes an output of the first transconductor.

14. The amplifier circuit of claim 13,
wherein the second transconductor comprises a transistor, wherein a drain electrode of the transistor is shorted with a gate electrode of the transistor and is coupled to an output of the first transconductor.

15. The amplifier circuit of claim 14,
wherein the third transconductor comprises a transistor, wherein a gate electrode of the transistor of the third transconductor is coupled to the gate electrode of the transistor of the second transconductor.

16. The amplifier circuit of claim 15,
wherein the first impedance element is connected between the gate electrode of the transistor of the second transconductor and a reference potential, and wherein the first impedance element is implemented so that a capacitance value of the first impedance element together with a gate-channel capacitance of the transistor of the second transconductor and a gate-channel capacitance of the transistor of the third transconductor yields a determined capacitance value.

17. The amplifier circuit of claim 16,
wherein the capacitance value is so that a phase shift that a negative transconductance of the second transconductor and an impedance of the first impedance element provide for a resonant frequency is equal to 360° minus a phase shift of a resonator coupled to the amplifier circuit at the resonant frequency.

18. The amplifier circuit of claim 15,
wherein the first impedance element is connected between a drain electrode of the transistor of the third transconductor and a reference potential, the first impedance comprising a transistor.

19. The amplifier circuit of claim 15,
further comprising a current source coupled to the gate electrode of the transistor of the third transconductor and to the gate electrode of the transistor of the second transconductor and coupled to the drain electrode of the third transistor of the first transconductor.

20. The amplifier circuit of claim 19,
further comprising a second current source coupled to a drain electrode of the transistor of the third transconductor.

21. The amplifier circuit of claim 20,
wherein the first or the second current source is controllable.

22. The amplifier circuit of claim 20,
wherein the first or the second current source is adjustable so that the following requirement is met:

$$-G_{m1}/G_{m2}>1$$

wherein $G_{m1}$ is a transconductance of a first transconductor, and $G_{m2}$ is a negative transconductance of a second transconductor.

23. The amplifier circuit of claim 1,
comprising a buffer amplifier coupled between at least one of the set of at least three transconductors and the amplifier output.

24. An oscillator circuit comprising:
an amplifier circuit having an amplifier input and an amplifier output for an oscillator having an oscillating frequency in a defined oscillating frequency range, comprising a set of at least three transconductors, wherein the transconductors are designed to map an input voltage to an output current considering the transconductance of the set of at least three transconductors, wherein a first transconductor has an input coupled to the amplifier input,
wherein a second transconductor has an input coupled to an output of the first transconductor and has a feedback connection from an output of the second transconductor,
wherein a third transconductor has an input coupled to an output of the first transconductor and an output of the second transconductor, and
wherein at least a first passive impedance element is coupled to the output of the first transconductor, wherein the transconductance and the at least first impedance element are dimensioned so that, in the defined oscillating frequency range, a given phase difference is present between a signal at the amplifier input and a signal at the amplifier output.
an FBAR (film bulk acoustic wave resonator) resonator connected between the amplifier input and the amplifier output.

25. The oscillator circuit of claim 24,
wherein the resonator has a phase shift at a resonant frequency of less than 70° and a resonant rise of less than 6 dB, and wherein the amplifier circuit is dimensioned to provide a phase shift by more than +290° and an amplification larger than 4 dB at the resonant frequency.

26. The oscillator of claim 24,
wherein the amplifier circuit and the resonator are integrated on a chip.

* * * * *